(12) United States Patent
Lee

(10) Patent No.: US 8,884,445 B2
(45) Date of Patent: Nov. 11, 2014

(54) SEMICONDUCTOR CHIP AND STACKED SEMICONDUCTOR PACKAGE HAVING THE SAME

(75) Inventor: Jin Hui Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 4 days.

(21) Appl. No.: 13/614,222

(22) Filed: Sep. 13, 2012

(65) Prior Publication Data

US 2013/0292843 A1    Nov. 7, 2013

(30) Foreign Application Priority Data

May 3, 2012    (KR) ........................ 10-2012-0047062

(51) Int. Cl.
| | | |
|---|---|---|
| H01L 23/48 | (2006.01) | |
| H01L 23/52 | (2006.01) | |
| H01L 29/40 | (2006.01) | |
| H01L 23/02 | (2006.01) | |
| H01L 21/00 | (2006.01) | |
| H01L 25/00 | (2006.01) | |
| H01L 25/065 | (2006.01) | |
| H01L 23/00 | (2006.01) | |
| H01L 23/544 | (2006.01) | |

(52) U.S. Cl.
CPC ....... H01L 24/81 (2013.01); *H01L 2924/15311* (2013.01); *H01L 2225/06593* (2013.01); *H01L 2225/06565* (2013.01); *H01L 2224/32225* (2013.01); *H01L 2224/16225* (2013.01); *H01L 2225/06513* (2013.01); *H01L 2225/06517* (2013.01); *H01L 2223/54426* (2013.01); *H01L 2223/54473* (2013.01); *H01L 2224/16145* (2013.01); *H01L 2224/73204* (2013.01); H01L 25/50 (2013.01); *H01L 2224/32145* (2013.01); *H01L 2225/06555* (2013.01); *H01L 2225/06541* (2013.01); H01L 25/0657 (2013.01); *H01L 2224/81141* (2013.01); H01L 23/544 (2013.01)
USPC .... 257/777; 257/774; 257/686; 257/E23.068; 438/107; 438/108; 438/109

(58) Field of Classification Search
CPC ................. H01L 25/0657; H01L 2225/06541; H01L 2225/06503; H01L 25/043; H01L 25/074; H01L 25/0756; H01L 25/117; H01L 2225/06555; H01L 2224/16145; H01L 2225/06593; H01L 2225/1082; H01L 24/81; H01L 23/544; H01L 2224/73204; H01L 2224/32145; H01L 2224/16225; H01L 2224/81141; H01L 2224/32225; H01L 2224/81139; H01L 2224/81138; H01L 2224/8114; H01L 2223/54473; H01L 2223/54426; H01L 2225/06513
USPC ................. 257/777, 724, 686, 109, E25.013, 257/E23.179, 774, 621, E23.011, E23.068, 257/797; 438/107, 667, 668, 672, 109, 455, 438/108
See application file for complete search history.

(56) References Cited

U.S. PATENT DOCUMENTS

| | | | |
|---|---|---|---|
| 2006/0055020 A1* | 3/2006 | Bolken et al. | 257/686 |
| 2009/0121323 A1* | 5/2009 | Kwon et al. | 257/621 |

FOREIGN PATENT DOCUMENTS

KR    1020120048841 A    5/2012

*Primary Examiner* — Fernando L Toledo
*Assistant Examiner* — Aaron Gray
(74) *Attorney, Agent, or Firm* — William Park & Associates Patent Ltd.

(57) ABSTRACT

A semiconductor chip includes a substrate having one surface and an other surface which substantially faces away from the one surface; at least two alignment bumps formed on the one surface of the substrate and having different diameters; and at least two alignment grooves defined on the other surface of the substrate and having different diameters.

12 Claims, 12 Drawing Sheets

SEMICONDUCTOR CHIP AND STACKED SEMICONDUCTOR PACKAGE HAVING THE SAME

CROSS-REFERENCE TO RELATED APPLICATIONS

The present application claims priority under 35 U.S.C. 119(a) to Korean Patent Application Number 10-2012-0047062 filed in the Korean Intellectual Property Office on May 3, 2012, which is incorporated herein by reference in its entirety.

BACKGROUND

1. Field of the Invention

The present invention generally relates to a semiconductor device, and more particularly, to a semiconductor chip which can provide an improved alignment precision when stacking semiconductor chips, thereby being suitable for preventing the occurrence of a poor connection between semiconductor chips, and a stacked semiconductor package having the same.

2. Description of the Related Art

Packaging technologies for a semiconductor device have been continuously developed according to demands toward miniaturization and high capacity, and recently, various technologies for a stacked semiconductor package capable of satisfying miniaturization, high capacity and mounting efficiency are being developed.

The term "stack" that is referred to in the semiconductor industry means a technology of vertically piling at least two semiconductor chips or semiconductor packages. In the case of a memory device, by using a stacking technology, it is possible to realize a product having memory capacity larger than that obtainable through semiconductor integration processes and improve mounting area utilization efficiency.

Among stacked semiconductor packages, a stacked semiconductor package using through electrodes has a structure in which through electrodes are formed in semiconductor chips and the semiconductor chips are stacked in such a way as to be electrically connected through the through electrodes. In the stacked semiconductor package using the through electrodes, since electrical connections are formed through the through electrodes, advantages are provided in that an operation speed can be improved and miniaturization is possible.

In the stacked semiconductor package using such through electrodes, if a misalignment occurs between stacked semiconductor chips, the positions of the through electrodes of an upwardly positioned semiconductor chip and the through electrodes of a downwardly positioned semiconductor chip are not aligned with each other, by which a poor connection occurs. Further, the occurrence of a poor connection becomes serious as the pitch of the through electrodes decreases by an influence of high integration.

SUMMARY

An embodiment is directed to a semiconductor chip which can provide an improved alignment precision when stacking semiconductor chips, thereby being suitable for preventing the occurrence of a poor connection between semiconductor chips.

Also, an embodiment is directed to a stacked semiconductor package having the semiconductor chip.

In an embodiment, a semiconductor chip includes: a substrate having one surface and an other surface which substantially faces away from the one surface; at least two alignment bumps formed on the one surface of the substrate and having different diameters; and at least two alignment grooves defined on the other surface of the substrate and having different diameters.

The semiconductor chip may further include through electrodes passing through the one surface and the other surface of the substrate.

An alignment bump and an alignment groove with a smallest diameter among the alignment bumps and the alignment grooves may have a diameter smaller than the through electrodes.

The respective alignment grooves may be defined to be individually arranged with the alignment bumps, and the respective alignment grooves may have substantially the same diameters as the corresponding alignment bumps.

The alignment bumps and the alignment grooves may be arranged in substantially a line and in order of diameter.

The substrate may further include: bonding pads formed on the one surface of the substrate; and a circuit block electrically connected with the bonding pads and configured to store, process or transmit data.

The substrate may be divided into a first region in which the bonding pads and the circuit block are disposed and a second region which is defined outside the first region, and the alignment bumps may be disposed on the one surface of the substrate in the second region and the alignment grooves may be defined on the other surface of the substrate in the second region.

The alignment bumps and the alignment grooves may be formed and defined to have heights that are proportional to the diameters thereof.

In an embodiment, a stacked semiconductor package includes: a plurality of semiconductor chips each including a substrate having one surface and an other surface which substantially faces away from the one surface, at least two alignment bumps formed on the one surface of the substrate and having different diameters, and at least two alignment grooves defined on the other surface of the substrate and having different diameters, the plurality of semiconductor chips being stacked upon one another, wherein the semiconductor chips are aligned through engagement of the alignment bumps of a lower semiconductor chip and the alignment grooves of an upper semiconductor chip.

Each semiconductor chip may further include through electrodes which pass through the one surface and the other surface of the substrate, and the plurality of semiconductor chips may be stacked such that their through electrodes are electrically connected with one another.

The stacked semiconductor package may further include conductive connection members formed between the through electrodes of the plurality of semiconductor chips and electrically connecting the through electrodes.

An alignment bump and an alignment groove with a smallest diameter among the alignment bumps and the alignment grooves of each semiconductor chip may have a diameter smaller than the through electrodes.

The respective alignment grooves of each semiconductor chip may be defined to be individually arranged with the alignment bumps of the semiconductor chip. Further, the respective alignment grooves may have substantially the same diameters as the corresponding alignment bumps.

The substrate of each semiconductor chip may further include: bonding pads formed on the one surface of the substrate; and a circuit block electrically connected with the bonding pads and configured to store, process or transmit data.

The substrate of each semiconductor chip may be divided into a first region in which the circuit block is disposed and a second region which is defined outside the first region, and the alignment grooves may be defined on the one surface of the substrate in the second region and the alignment bumps may be disposed on the other surface of the substrate in the second region.

The alignment bumps and the alignment grooves of each semiconductor chip may be arranged in substantially a line and in order of diameter.

In various cases, the stacked semiconductor package may further include an additional semiconductor chip having alignment grooves to be engaged with the alignment bumps of an uppermost semiconductor chip among the plurality of stacked semiconductor chips. In some cases, the stacked semiconductor package may further include an additional semiconductor chip having alignment bumps to be engaged with the alignment grooves of a lowermost semiconductor chip among the plurality of stacked semiconductor chips. The stacked semiconductor package may further include adhesive members formed between the stacked semiconductor chips.

DESCRIPTION OF SPECIFIC EMBODIMENTS

Figure 1:
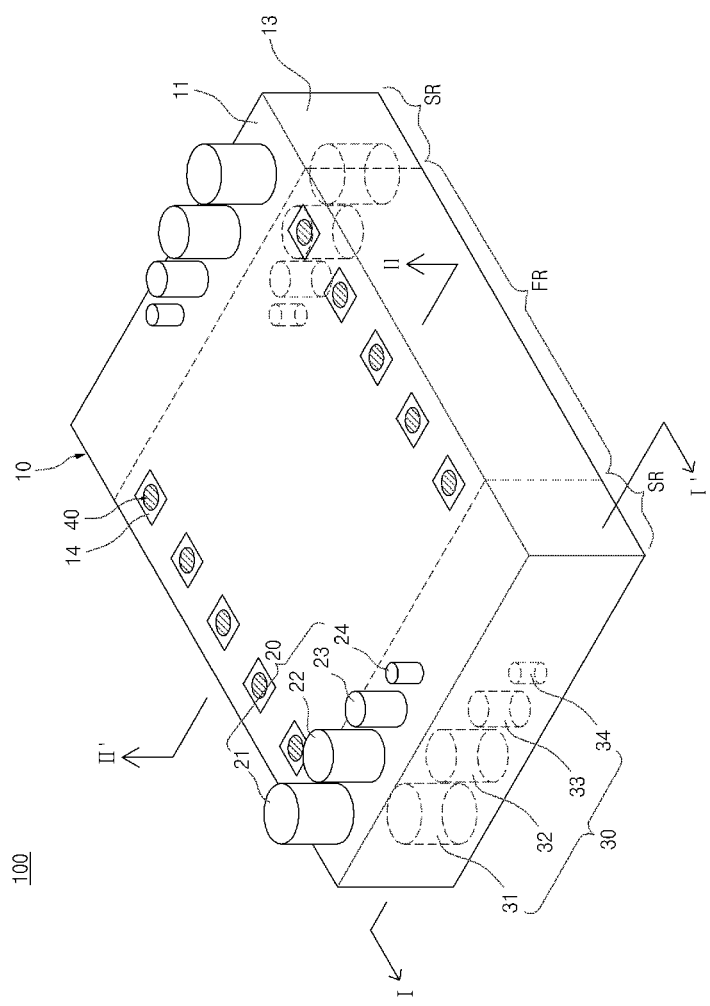
FIG. 1 is a perspective view illustrating a semiconductor chip in accordance with an embodiment.

Hereafter, embodiments will be described in detail with reference to the accompanying drawings.

It is to be understood herein that the drawings are not necessarily to scale and in some instances proportions may have been exaggerated in order to more clearly depict certain features of the embodiments. The same reference numerals or the same reference designators may denote the same elements throughout the specification.

Figure 2:
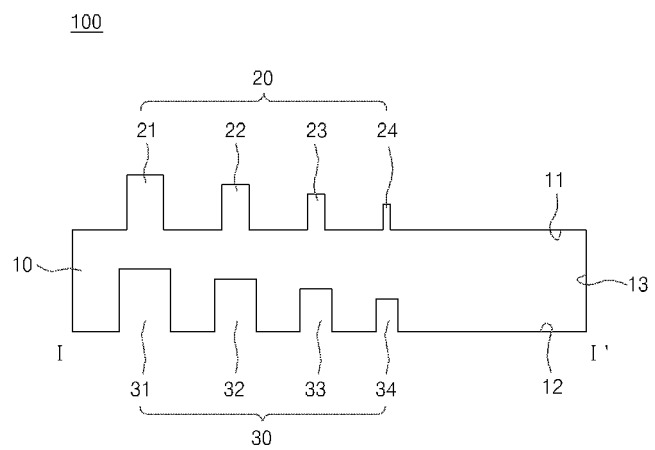
FIG. 2 is a cross-sectional view taken along the line I-I' of FIG. 1.
Figure 3:
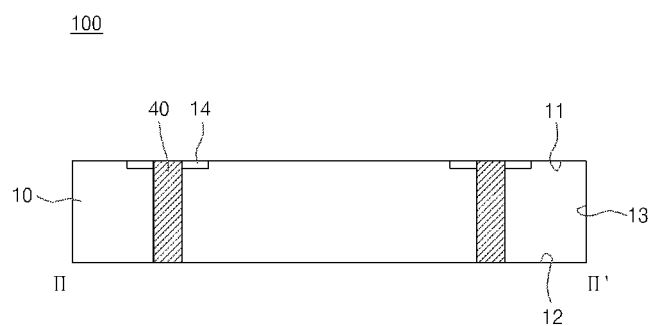
FIG. 3 is a cross-sectional view taken along the line II-II' of FIG. 1.

FIG. 1 is a perspective view illustrating a semiconductor chip in accordance with an embodiment of the present invention, FIG. 2 is a cross-sectional view taken along the line I-I' of FIG. 1, and FIG. 3 is a cross-sectional view taken along the line II-II' of FIG. 1.

Referring to FIGS. 1 to 3, a semiconductor chip 100 in accordance with an embodiment may include a substrate 10, a plurality of alignment bumps 20, and a plurality of alignment grooves 30. Besides, the semiconductor chip 100 further may include through electrodes 40.

The substrate 10 may be divided into a first region FR and a second region SR which may be defined outside the first region FR. The substrate 10 may include one surface 11, the other surface 12, side surfaces 13, a circuit block (not shown), and bonding pads 14.

The one surface 11 may face away from the other surface 12, and the side surfaces 13 may connect the one surface 11 and the other surface 12. The circuit block may be formed in the first region FR of the substrate 10 and may include elements such as transistors, capacitors, resistors, etc. for storing, processing and transmitting data. The bonding pads 14 as electrical contacts of the circuit block for connection to an outside may be formed on the one surface 11 of the substrate 10 in the first region FR. Although it is illustrated and described in the present embodiment that the bonding pads 14 may be formed on the one surface 11 of the substrate 10 in the first region FR, it is to be noted that the bonding pads 14 may be formed on the other surface 12 of the substrate 10 in the first region FR.

The alignment bumps 20 may be formed on the one surface 11 of the substrate 11 in the second region SR, and may include at least two bumps which have different diameters. In an embodiment, the alignment bumps 20 may include first, second, third, and fourth alignment bumps 21, 22, 23 and 24 which have different diameters. Among the first, second, third and fourth alignment bumps 21, 22, 23 and 24, the diameter of the first alignment bump 21 may be largest, the diameter of the second alignment bump 22 may be largest except for the first alignment bump 21, the diameter of the third alignment bump 23 may be largest except for the first and second alignment bumps 21 and 22, and the diameter of the fourth alignment bump 24 may be the smallest.

In an embodiment, the alignment bumps 20 may have heights proportional to the diameters thereof. For example, the height of the first alignment bump 21 with the largest diameter may be the highest, the height of the second alignment bump 22 may be the highest except for the height of the first alignment bump 21, the height of the third alignment bump 23 may be the highest except for the height of the first and second alignment bump 21 and 22, and the height of the fourth alignment bump 24, with the smallest diameter, may be the lowest.

The alignment grooves 30 may be defined on the other surface 12 of the substrate 10 in the second region SR, and may include at least two grooves which have different diameters. In an embodiment, the alignment grooves 30 may include first, second, third, and fourth alignment grooves 31, 32, 33, and 34 which may have different diameters.

The respective alignment grooves 30 may be defined to be individually arranged with the alignment bumps 20 and have the same diameters as the corresponding alignment bumps 20. Additionally, the first alignment groove 31 may be defined to be arranged with the first alignment bump 21 and may have substantially the same diameter as the first alignment bump 21, and the second alignment groove 32 may be defined to be arranged with the second alignment bump 22 and may have substantially the same diameter as the second alignment bump 22. Further, the third alignment groove 33 may be defined to be arranged with the third alignment bump 23 and may have substantially the same diameter as the third alignment bump 23, and the fourth alignment groove 34 may be defined to be arranged with the fourth alignment bump 24 and may have substantially the same diameter as the fourth alignment bump 24.

The fourth alignment bump 24 and the fourth alignment groove 34 which may have the smallest sizes among the alignment bumps 20 and the alignment grooves 30 may be formed and defined to have a diameter smaller than that of the through electrodes 40.

In an embodiment, the alignment bumps 20 and the alignment grooves 30 may be arranged in line in order of diameter. In some cases, while not shown in a drawing, the alignment bumps 20 and the alignment grooves 30 may be randomly arranged regardless of diameter.

The through electrodes 40 may pass through the one surface 11 and the other surface 12 of the substrate 10 in the first region FR and may be electrically connected with the bonding pads 14. In an embodiment, the through electrodes 40 may pass through the bonding pads 14. In various cases, the through electrodes 40 may not pass through the bonding pads 14 and instead, may pass through portions of the circuit block which may be electrically connected with the bonding pads 14.

Hereafter, stacked semiconductor packages with the above-described semiconductor chip will be described.

Figure 4:
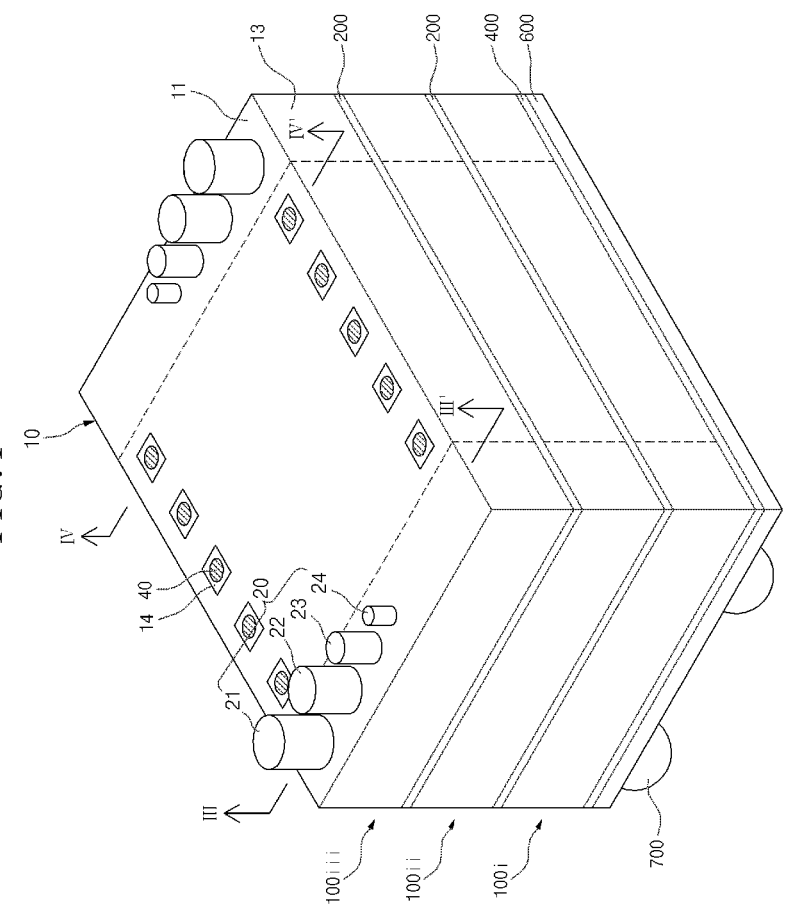
FIG. 4 is a perspective view illustrating a stacked semiconductor package in accordance with an embodiment.
Figure 5:
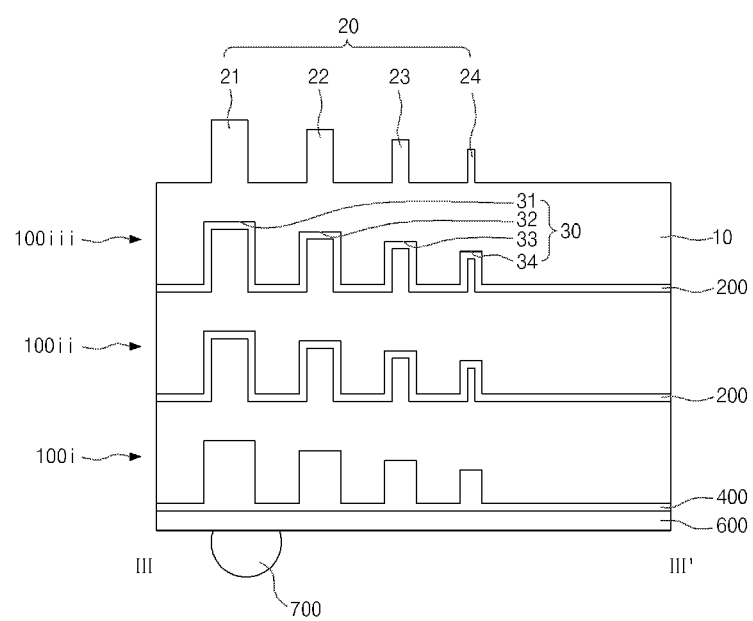
FIG. 5 is a cross-sectional view taken along the line III-III' of FIG. 4.
Figure 6:
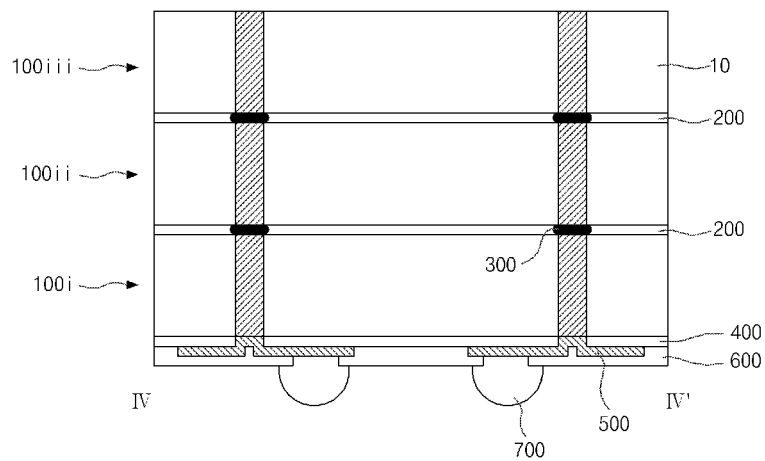
FIG. 6 is a cross-sectional view taken along the line IV-IV' of FIG. 4.

FIG. 4 is a perspective view illustrating a stacked semiconductor package in accordance with an embodiment, FIG. 5 is a cross-sectional view taken along the line III-III' of FIG. 4, and FIG. 6 is a cross-sectional view taken along the line IV-IV' of FIG. 4.

Referring to FIGS. 4 to 6, after a plurality of semiconductor chips 100*i* to 100*iii*, each of which has alignment bumps 20, alignment grooves 30, and through electrodes 40, are prepared, the second semiconductor chip 100*ii* may be stacked on the first semiconductor chip 100*i* in such a manner that the alignment bumps 20 of the first semiconductor chip 100*i* and the alignment grooves 30 of the second semiconductor chip 100*ii* may be engaged with one another and the through electrodes 40 of the first semiconductor chip 100*i* and the through electrodes 40 of the second semiconductor chip 100*ii* may be electrically connected with each other. In this way, a plurality of semiconductor chips, for example, the three semiconductor chips 100*i* to 100*iii* may be stacked.

Adhesive members 200 may be formed between the stacked semiconductor chips 100*i* to 100*iii*, and conductive connection members 300 may be formed between the through electrodes 40 of the semiconductor chips 100*i* to 100*iii*. The adhesive members 200 may include a non-conductive paste, and the conductive connection members 300 may include solders.

A first dielectric layer 400 may be formed on the lower surface of the first semiconductor chip 100*i* as a lowermost semiconductor chip among the stacked semiconductor chips 100*i* to 100*iii*, to expose the through electrodes 40 of the first semiconductor chip 100*i*, and redistribution lines 500 may be formed on the first dielectric layer 400 to be electrically connected with the through electrodes 40 of the first semiconductor chip 100*i*. A second dielectric layer 600 may be formed on the first dielectric layer 400 including the redistribution lines 500 to expose portions of the redistribution lines 500, and external connection terminals 700 may be mounted to the portions of the redistribution lines 500 which are exposed through the second dielectric layer 600.

Figure 7:
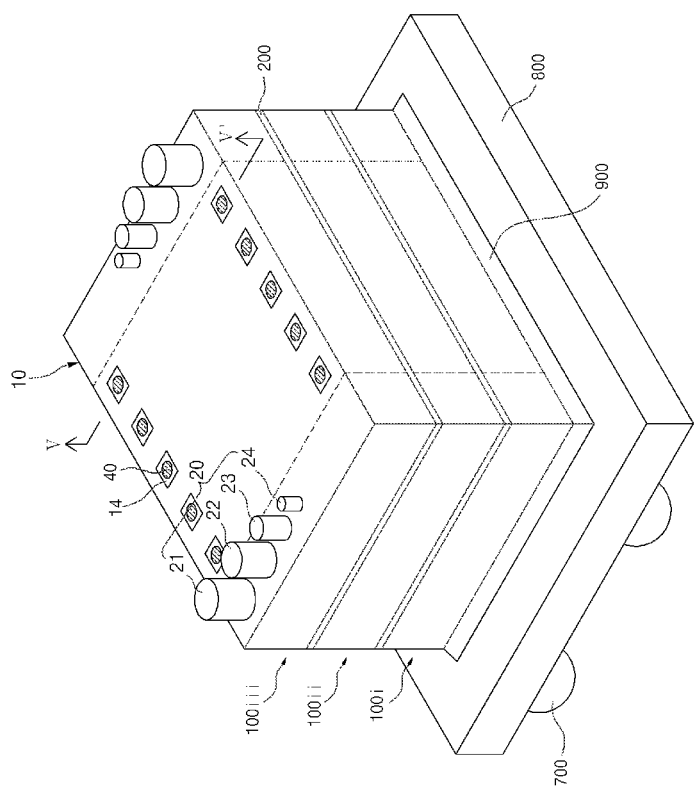
FIG. 7 is a perspective view illustrating a stacked semiconductor package in accordance with an embodiment.
Figure 8:
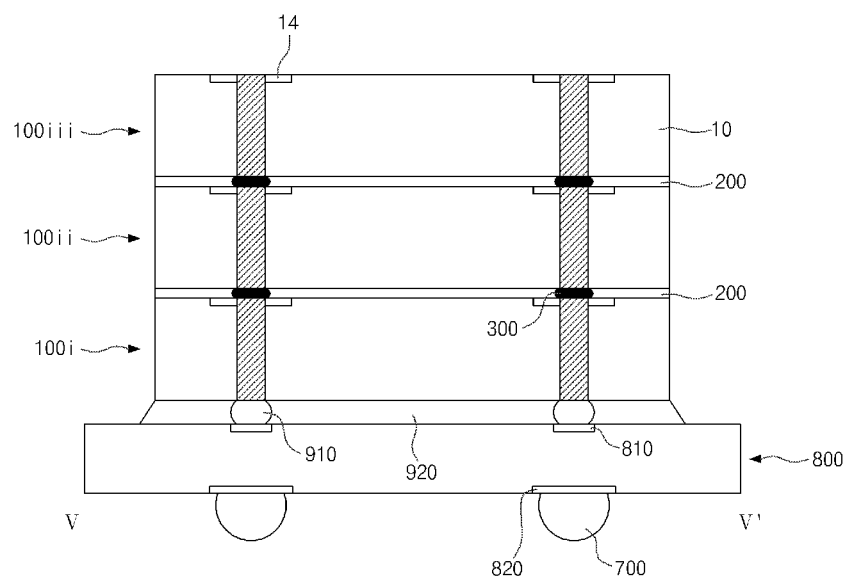
FIG. 8 is a cross-sectional view taken along the line V-V' of FIG. 7.

FIG. 7 is a perspective view illustrating a stacked semiconductor package in accordance with an embodiment of the present invention, and FIG. 8 is a cross-sectional view taken along the line V-V' of FIG. 7.

Referring to FIGS. 7 and 8, after a plurality of semiconductor chips 100*i* to 100*iii*, each of which has alignment bumps 20, alignment grooves 30 (not shown), and through electrodes 40, are prepared, the second semiconductor chip 100*ii* may be stacked on the first semiconductor chip 100*i* in such a manner that the alignment bumps 20 of the first semiconductor chip 100*i* and the alignment grooves 30 of the second semiconductor chip 100*ii* may be engaged with one another and the through electrodes 40 of the first semiconductor chip 100*i* and the through electrodes 40 of the second semiconductor chip 100*ii* may be electrically connected with each other. In this way, a plurality of semiconductor chips, for example, the three semiconductor chips 100*i* to 100*iii* may be stacked.

Adhesive members 200 may be formed between the stacked semiconductor chips 100*i* to 100*iii*, and conductive connection members 300 may be formed between the through electrodes 40 of the semiconductor chips 100*i* to 100*iii*. The adhesive members 200 may include a non-conductive paste, and the conductive connection members 300 may include solders.

The stacked semiconductor chips 100*i* to 100*iii* may be mounted to a structural body 800 in such a manner that the through electrodes 40 of the first semiconductor chip 100*i* as a lowermost semiconductor chip among the stacked semiconductor chips 100*i* to 100*iii* may be electrically connected with connection electrodes 810 of the structural body 800. In an embodiment, the structural body 800 may be constituted by a printed circuit board (PCB).

The through electrodes 40 of the first semiconductor chip 100*i* and the connection electrodes 810 of the structural body 800 may be electrically connected with each other by conductive connection members 910. An adhesive member 920 may be formed between the first semiconductor chip 100*i* and the structural body 800. The reference numeral 820 may designate ball lands, and 700 may designate external connection terminals which may be mounted to the ball lands 820.

Although it was illustrated and described in an embodiment that the structural body 800 may be constituted by a printed circuit board, it is to be noted that the structural body 800 may be constituted by another semiconductor structure such as a semiconductor package and an interposer.

Figure 9:
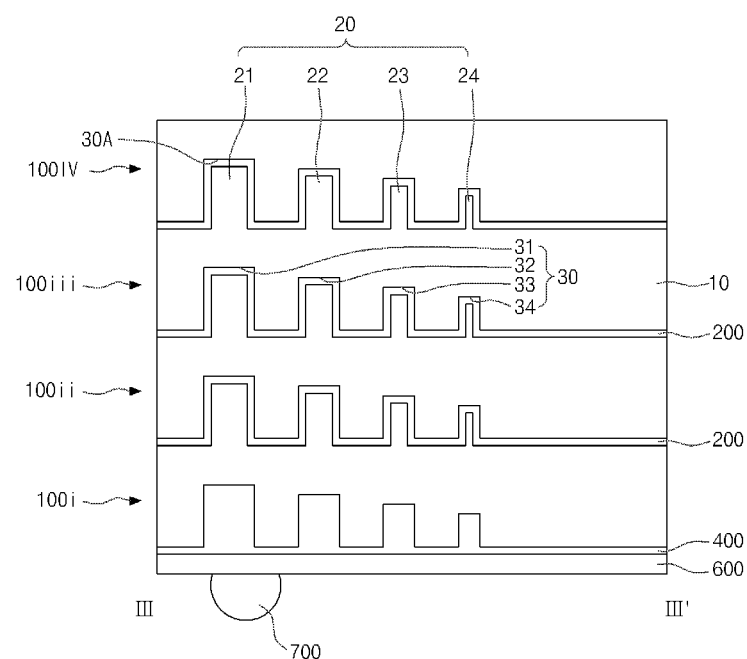
FIG. 9 is a cross-sectional view illustrating a stacked semiconductor package in accordance with an embodiment.

FIG. 9 is a cross-sectional view illustrating a stacked semiconductor package in accordance with an embodiment. The stacked semiconductor package in accordance with an embodiment has a construction that an additional semiconductor chip 100IV may be added to the stacked semiconductor package in accordance with the embodiments described above with reference to FIGS. 4 to 6. Accordingly, the stacked semiconductor package in accordance with the embodiments associated with FIG. 9 has substantially the same construction as the stacked semiconductor package in accordance with the embodiments associated with FIGS. 4 to 6 except the additional semiconductor chip 100IV. Therefore, repeated descriptions for the same component parts will be omitted herein, and the same terms and the same reference numerals will be used to refer to the same component parts.

Referring to FIG. 9, after a plurality of semiconductor chips 100*i* to 100*iii*, each of which has alignment bumps 20, alignment grooves 30, and through electrodes (not shown), are prepared, the second semiconductor chip 100*ii* may be stacked on the first semiconductor chip 100*i* in such a manner that the alignment bumps 20 of the first semiconductor chip 100*i* and the alignment grooves 30 of the second semiconductor chip 100*ii* may be engaged with one another and the through electrodes of the first semiconductor chip 100*i* and the through electrodes of the second semiconductor chip 100*ii* may be electrically connected with each other. In this way, a plurality of semiconductor chips, for example, the three semiconductor chips 100*i* to 100*iii* may be stacked.

An additional semiconductor chip 100IV which has alignment grooves 30A to be engaged with the alignment bumps 20 of the third semiconductor chip 100*iii* as an uppermost semiconductor chip among the stacked semiconductor chips 100*i* to 100*iii* may be stacked on the third semiconductor chip 100*iii*.

While not shown, the additional semiconductor chip 100IV has bonding pads which may be electrically connected with the through electrodes of the third semiconductor chip 100*iii*. Besides, the additional semiconductor chip 100IV may further have through electrodes (not shown) which may be electrically connected with the through electrodes of the third semiconductor chip 100*iii*.

Adhesive members 200 may be formed between the stacked semiconductor chips 100*i* to 100*iii* and the additional semiconductor chip 100IV, and conductive connection members (not shown) may be formed between the through electrodes of the semiconductor chips 100*i* to 100*iii* and the additional semiconductor chip 100IV. The adhesive members 200 may include a non-conductive paste, and the conductive connection members may include solders.

Figure 10:
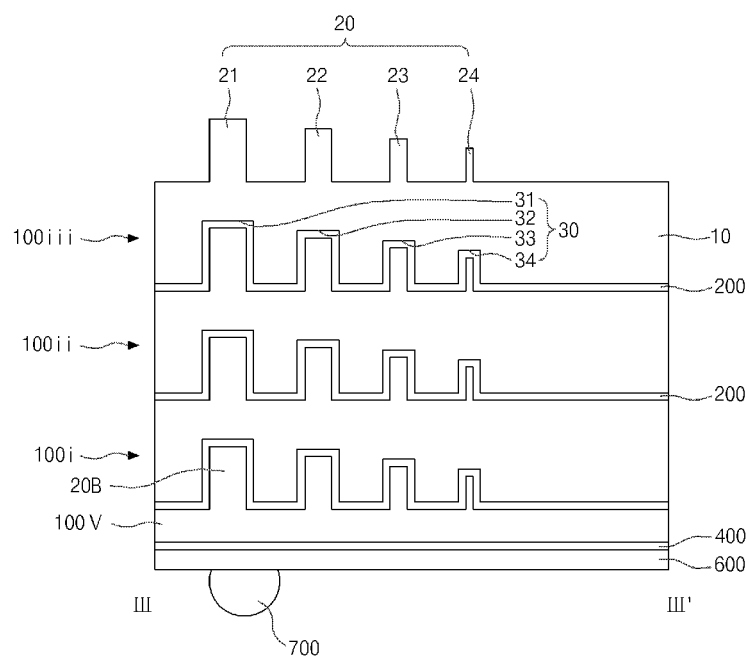
FIG. 10 is a cross-sectional view illustrating a stacked semiconductor package in accordance with an embodiment.

FIG. 10 is a cross-sectional view illustrating a stacked semiconductor package in accordance with an embodiment. The stacked semiconductor package in accordance with an embodiment has a construction that an additional semiconductor chip 100V is added to the stacked semiconductor package in accordance with the embodiments described above with reference to FIGS. 4 to 6. Accordingly, the stacked semiconductor package in accordance with an embodiment with reference to FIG. 10 has substantially the same construction as the stacked semiconductor package in accordance with the embodiments associated with FIGS. 4 to 6 except the additional semiconductor chip 100V. Therefore, repeated descriptions for the same component parts will be omitted herein, and the same terms and the same reference numerals will be used to refer to the same component parts.

Referring to FIG. 10, after a plurality of semiconductor chips 100*i* to 100*iii*, each of which has alignment bumps 20, alignment grooves 30, and through electrodes (not shown), are prepared, the second semiconductor chip 100*ii* may be stacked on the first semiconductor chip 100*i* in such a manner that the alignment bumps 20 of the first semiconductor chip 100*i* and the alignment grooves 30 of the second semiconductor chip 100*ii* may be engaged with one another and the through electrodes of the first semiconductor chip 100*i* and the through electrodes of the second semiconductor chip 100*ii* may be electrically connected with each other. In this way, a plurality of semiconductor chips, for example, the three semiconductor chips 100*i* to 100*iii* may be stacked.

An additional semiconductor chip 100V which has alignment bumps 20B to be engaged with the alignment grooves 30 of the first semiconductor chip 100*i* as a lowermost semiconductor chip among the stacked semiconductor chips 100*i* to 100*iii* may be stacked under the first semiconductor chip 100*i*. While not shown, the additional semiconductor chip 100V has through electrodes which may be electrically connected with the through electrodes of the first semiconductor chip 100*i*.

Adhesive members 200 may be formed between the stacked semiconductor chips 100*i* to 100*iii* and the additional semiconductor chip 100V, and conductive connection members (not shown) may be formed between the through electrodes of the semiconductor chips 100*i* to 100*iii* and the additional semiconductor chip 100V. The adhesive members 200 may include a non-conductive paste, and the conductive connection members may include solders.

A first dielectric layer 400 may be formed on the lower surface of the additional semiconductor chip 100V to expose the through electrodes of the additional semiconductor chip 100V, and redistribution lines 500 (not shown) may be formed on the first dielectric layer 400 to be electrically connected with the through electrodes of the additional semiconductor chip 100V. A second dielectric layer 600 may be formed on the first dielectric layer 400 including the redistribution lines 500 (not shown) to expose portions of the redistribution lines 500 (not shown), and external connection terminals 700 may be mounted to the portions of the redistribution lines 500 (not shown) which may be exposed through the second dielectric layer 600.

Figure 11:
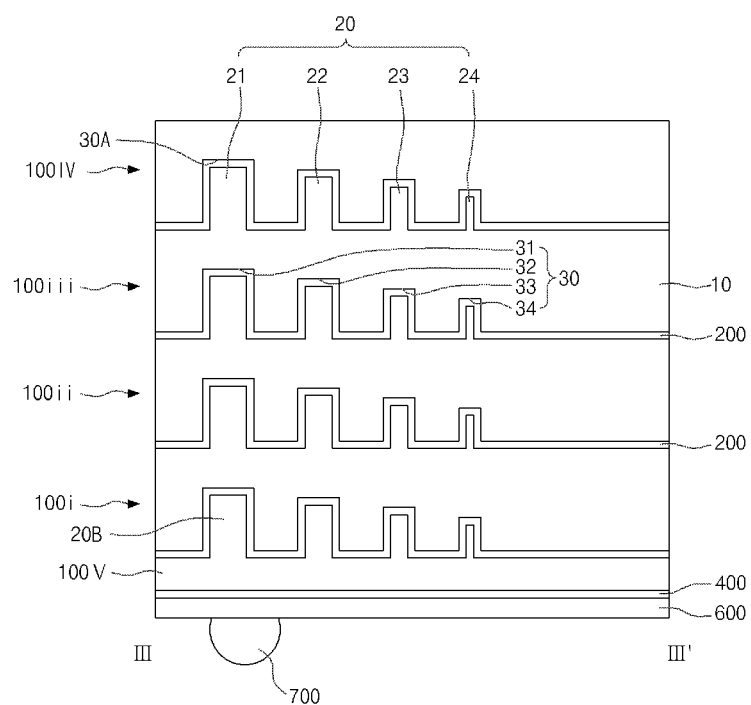
FIG. 11 is a cross-sectional view illustrating a stacked semiconductor package in accordance with an embodiment.

FIG. 11 is a cross-sectional view illustrating a stacked semiconductor package in accordance with an embodiment. The stacked semiconductor package in accordance with an embodiment may have a construction where a first additional semiconductor chip 100IV and a second additional semiconductor chip 100V are added to the stacked semiconductor package in accordance with the embodiments described above with reference to FIGS. 4 to 6. Accordingly, the stacked semiconductor package in accordance with an embodiment may have substantially the same construction as the stacked semiconductor package in accordance with the embodiments associated with FIGS. 4 to 6 except the first and second additional semiconductor chips 100IV and 100V. Therefore, repeated descriptions for the same component parts will be omitted herein, and the same terms and the same reference numerals will be used to refer to the same component parts.

Referring to FIG. 11, after a plurality of semiconductor chips 100*i* to 100*iii*, each of which has alignment bumps 20, alignment grooves 30, and through electrodes (not shown), are prepared, the second semiconductor chip 100*ii* may be stacked on the first semiconductor chip 100*i* in such a manner that the alignment bumps 20 of the first semiconductor chip 100*i* and the alignment grooves 30 of the second semiconductor chip 100*ii* may be engaged with one another and the through electrodes of the first semiconductor chip 100*i* and the through electrodes of the second semiconductor chip 100*ii* may be electrically connected with each other. In this way, a plurality of semiconductor chips, for example, the three semiconductor chips 100*i* to 100*iii* may be stacked.

A first additional semiconductor chip 100IV which has alignment grooves 30A to be engaged with the alignment bumps 20 of the third semiconductor chip 100*iii* as an uppermost semiconductor chip among the stacked semiconductor chips 100*i* to 100*iii* may be stacked on the third semiconductor chip 100*iii*, and a second additional semiconductor chip 100V which has alignment bumps 20B to be engaged with the alignment grooves 30 of the first semiconductor chip 100*i* as a lowermost semiconductor chip among the stacked semiconductor chips 100*i* to 100*iii* may be stacked under the first semiconductor chip 100*i*.

While not shown, the first additional semiconductor chip 100IV has bonding pads which may be electrically connected with the through electrodes of the third semiconductor chip 100*iii*. Besides, the first additional semiconductor chip 100IV may further have through electrodes which may be electrically connected with the through electrodes of the third semiconductor chip 100*iii*. Further, the second additional semiconductor chip 100V has through electrodes which may be electrically connected with the through electrodes of the first semiconductor chip 100i as the lowermost semiconductor chip.

Adhesive members 200 may be formed between the stacked semiconductor chips 100i to 100iii and the first and second additional semiconductor chips 100IV and 100V, and conductive connection members (not shown) may be formed between the through electrodes of the semiconductor chips 100i to 100iii and the through electrodes of the first and second additional semiconductor chips 100IV and 100V. The adhesive members 200 may include a non-conductive paste, and the conductive connection members may include solders.

A first dielectric layer 400 may be formed on the lower surface of the second additional semiconductor chip 100V to expose the through electrodes of the second additional semiconductor chip 100V, and redistribution lines 500 (not shown) may be formed on the first dielectric layer 400 to be electrically connected with the through electrodes of the second additional semiconductor chip 100V. A second dielectric layer 600 may be formed on the first dielectric layer 400 including the redistribution lines 500 (not shown) to expose portions of the redistribution lines 500 (not shown), and external connection terminals 700 may be mounted to the portions of the redistribution lines 500 (not shown) which may be exposed through the second dielectric layer 600.

The aforementioned stacked semiconductor package may be applied to various electronic apparatuses.

Figure 12:
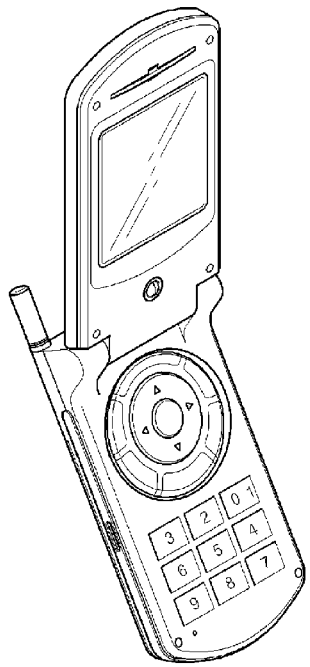
FIG. 12 is a perspective view illustrating an electronic apparatus which has the stacked semiconductor package according to an embodiment.

FIG. 12 is a perspective view illustrating an electronic apparatus which has the stacked semiconductor package according to the various embodiments.

Referring to FIG. 12, the stacked semiconductor package according to the embodiments of the present invention may be applied to an electronic apparatus 1000 such as a portable phone. Since the stacked semiconductor package according to the embodiments provides advantages in that it is possible to prevent the occurrence of a fail, advantages are provided in improving the reliability of the electronic apparatus 1000. The electronic apparatus 1000 is not limited to the portable phone shown in FIG. 12, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 13:
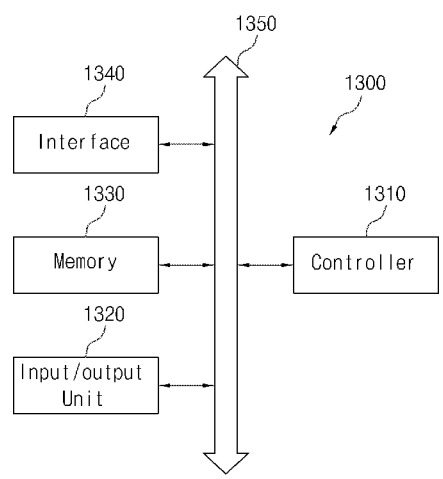
FIG. 13 is a block diagram showing an example of an electronic apparatus which includes the stacked semiconductor package according to an embodiment.

FIG. 13 is a block diagram showing an example of an electronic apparatus which may include the stacked semiconductor package according to the various embodiments.

Referring to FIG. 13, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the stacked semiconductor package according to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

As is apparent from the above description, according to the present invention, since an alignment precision is improved when stacking semiconductor chips, it is possible to prevent the occurrence of a poor connection due to a misalignment between stacked semiconductor chips, whereby the manufacturing yield may be elevated. Also, as a coupling force between the stacked semiconductor chips is increased, deformation due to an external shock or a difference in thermal expansion coefficient is suppressed, whereby the reliability of a product may be enhanced.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
a substrate having one surface, an other surface which substantially faces away from the one surface, bonding pads formed on the one surface of the substrate, and a circuit block electrically connected with the bonding pads and configured to store, process, or transmit data,
wherein the substrate is divided into a first region in which the bonding pads and the circuit block are disposed and a second region which is defined outside the first region;
at least two alignment bumps formed on the one surface of the substrate in the second region and having different diameters;
at least two alignment grooves defined on the other surface of the substrate in the second region and having different diameters; and
through electrodes passing through the one surface and the other surface of the substrate in the first region,
wherein an alignment bump and an alignment groove with a smallest diameter among the alignment bumps and the alignment grooves have a diameter smaller than the through electrodes, and
wherein heights from the at least two alignment bumps to a bottom portion of the substrate are different from heights from the at least two alignment grooves to the bottom portion of the substrate, wherein at least two alignment bumps have different heights and at least two alignment grooves have different depths.

2. The semiconductor chip according to claim 1, wherein respective alignment grooves are defined to be individually arranged with the alignment bumps.

3. The semiconductor chip according to claim 2, wherein the respective alignment grooves have substantially the same diameters as the corresponding alignment bumps.

4. The semiconductor chip according to claim 1, wherein the alignment bumps and the alignment grooves are arranged in substantially a line and in order of diameter.

5. The semiconductor chip according to claim 1, wherein the alignment bumps and the alignment grooves are formed and defined to have heights that are proportional to the diameters thereof.

6. A stacked semiconductor package comprising:
a plurality of semiconductor chips each including a substrate having one surface, an other surface which substantially faces away from the one surface, bonding pads formed on the one surface of the substrate, and a circuit block electrically connected with the bonding pads and configured to store, process, or transmit data, wherein the substrate is divided into a first region in which the bonding pads and the circuit block are disposed and a second region which is defined outside the first region, at least two alignment bumps formed on the one surface of the substrate in the second region and having different diameters, at least two alignment grooves defined on the other surface of the substrate in the second region and having different diameters, and through electrodes which pass through the one surface and the other surface of the substrate in the first region, the plurality of semiconductor chips being stacked upon one another such that their through electrodes are electrically connected with one another,
wherein an alignment bump and an alignment groove with a smallest diameter among the alignment bumps and the alignment grooves of each semiconductor chip have a diameter smaller than the through electrodes,
wherein the semiconductor chips are aligned through engagement of the alignment bumps of a lower semiconductor chip and the alignment grooves of an upper semiconductor chip, and
wherein heights from the at least two alignment bumps to a bottom portion of the substrate are different from heights from the at least two alignment grooves to the bottom portion of the substrate, wherein at least two alignment bumps have different heights and at least two alignment grooves have different depths.

7. The stacked semiconductor package according to claim 6, further comprising:
conductive connection members formed between the through electrodes of the semiconductor chips and electrically connecting the through electrodes.

8. The stacked semiconductor package according to claim 6, wherein respective alignment grooves of each semiconductor chip are defined to be individually arranged with the alignment bumps of the semiconductor chip.

9. The stacked semiconductor package according to claim 8, wherein the respective alignment grooves have substantially the same diameters as the corresponding alignment bumps.

10. The stacked semiconductor package according to claim 6, wherein the alignment bumps and the alignment grooves of each semiconductor chip are arranged in substantially a line and in order of diameter.

11. The stacked semiconductor package according to claim 6, further comprising:
an additional semiconductor chip having alignment grooves to be engaged with the alignment bumps of an uppermost semiconductor chip among the plurality of stacked semiconductor chips.

12. The stacked semiconductor package according to claim 6, further comprising:
an additional semiconductor chip having alignment bumps to be engaged with the alignment grooves of a lowermost semiconductor chip among the plurality of stacked semiconductor chips.

* * * * *